United States Patent
Kim et al.

(10) Patent No.: US 10,147,896 B2
(45) Date of Patent: Dec. 4, 2018

(54) ORGANIC THIN FILM TRANSISTOR AND METHOD OF MANUFACTURING THE SAME

(71) Applicant: SAMSUNG DISPLAY CO., LTD., Yongin-si, Gyeonggi-do (KR)

(72) Inventors: Seung Hun Kim, Hwaseong-si (KR); Hyo Jeong Kwon, Seoul (KR); Il Hwa Hong, Hwaseong-si (KR); Seung Yong Song, Suwon-si (KR); Sang Hwan Cho, Suwon-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/591,257

(22) Filed: May 10, 2017

(65) Prior Publication Data
US 2017/0331060 A1 Nov. 16, 2017

(30) Foreign Application Priority Data
May 11, 2016 (KR) .................. 10-2016-0057488

(51) Int. Cl.
*H01L 51/40* (2006.01)
*H01L 51/05* (2006.01)
*H01L 51/00* (2006.01)

(52) U.S. Cl.
CPC ...... *H01L 51/0545* (2013.01); *H01L 51/0002* (2013.01); *H01L 51/004* (2013.01); *H01L 51/0034* (2013.01); *H01L 51/0036* (2013.01); *H01L 51/0041* (2013.01)

(58) Field of Classification Search
CPC .................. H01L 51/0533; H01L 51/0537
See application file for complete search history.

(56) References Cited

U.S. PATENT DOCUMENTS

| 6,150,191 A | 11/2000 | Bao |
| 6,740,900 B2 | 5/2004 | Hirai |
| 2011/0284849 A1* | 11/2011 | Marks ............. B82Y 40/00 |
| | | 257/57 |

FOREIGN PATENT DOCUMENTS

| KR | 10-2005-0060513 A | 6/2005 |
| KR | 10-2006-0010764 A | 2/2006 |
| KR | 10-2007-0061246 A | 6/2007 |
| KR | 10-2007-0121892 A | 12/2007 |

OTHER PUBLICATIONS

Pentacene TFT With Reduced Threshold Voltage Using PMMA-co-MMA/Sol-Gel-Derived TiO2 Composite Insulator by Jaehoon Park et al. IEEE Electron Device Letters, vol. 30, No. 11, Nov. 2009.*

* cited by examiner

*Primary Examiner* — Eric A. Ward
(74) *Attorney, Agent, or Firm* — Lee & Morse, P.C.

(57) ABSTRACT

An organic thin film transistor and a method of manufacturing the same, the transistor including a gate electrode; an organic semiconductor layer overlapping the gate electrode; and an insulating layer between the gate electrode and the organic semiconductor layer, the insulating layer having an organic/inorganic hybrid region, wherein the organic/inorganic hybrid region includes a polymer and an inorganic material that is chemically bonded to the polymer through a reactive group on the polymer, and the insulating layer includes a space adjacent to the polymer, the inorganic material being positioned in the space.

18 Claims, 11 Drawing Sheets

ORGANIC THIN FILM TRANSISTOR AND METHOD OF MANUFACTURING THE SAME

CROSS-REFERENCE TO RELATED APPLICATION

Korean Patent Application No. 10-2016-0057488, filed on May 11, 2016, in the Korean Intellectual Property Office, and entitled: "Organic Thin Film Transistor and Method of Manufacturing the Same," is incorporated by reference herein in its entirety.

BACKGROUND

1. Field

Embodiments relate to an organic thin film transistor and a manufacturing method thereof.

2. Description of the Related Art

Recently, many studies on an electric element using an organic semiconductor have been conducted for reasons of membrane flexibility made of an organic material and a possibility of low temperature deposition. Among them, an organic thin film transistor may be variously used as a switching thin film transistor or a driving thin film transistor in a display element by being replaced by a conventional inorganic thin film transistor.

The above information disclosed in this Background section is only for enhancement of understanding of the background of the invention and therefore it may contain information that does not form the prior art that is already known in this country to a person of ordinary skill in the art.

SUMMARY

Embodiments are directed to an organic thin film transistor and a manufacturing method thereof.

The embodiments may be realized by providing an organic thin film transistor including a gate electrode; an organic semiconductor layer overlapping the gate electrode; and an insulating layer between the gate electrode and the organic semiconductor layer, the insulating layer having an organic/inorganic hybrid region, wherein the organic/inorganic hybrid region includes a polymer and an inorganic material that is chemically bonded to the polymer through a reactive group on the polymer, and the insulating layer includes a space adjacent to the polymer, the inorganic material being positioned in the space.

In the organic/inorganic hybrid region, a concentration of the inorganic material may be decreased in a direction away from the organic semiconductor layer.

The inorganic material may include at least one selected from the group consisting of an aluminum oxide, a zirconium oxide, a hafnium oxide, and a titanium oxide.

The insulating layer may further include a region including the organic material, the region including the organic material being between the gate electrode and the organic/inorganic hybrid region.

The inorganic material may include a group in which aluminum and oxygen are alternately chemical-bonded, a group in which zirconium and oxygen are alternately chemical-bonded, a group in which hafnium and oxygen are alternately chemical-bonded, or a group in which titanium and oxygen are alternately chemical-bonded.

The organic semiconductor layer may include at least one selected from the group consisting of polythiophene, polyacetylene, poly(3-alkylthiophene), poly(thienylenevinylene), poly(3-hexylthiophene), and polypropylene.

The polymer including the reactive group may include at least one selected from the group consisting of an acryl resin, polyimide, polyurethane, polyethylene terephthalate, polyethylene naphthalate, polybutylene terephthalate, and polyethersulfone.

Edge side walls of the organic semiconductor layer and the insulating layer may be substantially aligned.

The embodiments may be realized by providing a method for manufacturing an organic thin film transistor, the method including forming a gate electrode on a substrate; forming an organic insulating layer on the gate electrode; forming an organic semiconductor layer on the organic insulating layer; exposing the organic semiconductor layer and the organic insulating layer to a precursor gas atmosphere; exposing the organic semiconductor layer and the organic insulating layer to a reactant gas atmosphere; and forming an organic/inorganic hybrid region in the organic insulating layer.

Forming the organic insulating layer and the organic semiconductor layer may be performed using the same mask.

The precursor gas may include a material that reacts to form an aluminum oxide, a titanium oxide, a zirconium oxide, or a hafnium oxide.

The precursor gas may include $Al(CH_3)_3$, $Al[C(CH_3)_3]_3$, $TiCl_4$, $Ti[N(CH_3)(C_2H_5)]_4$, $Ti[N(CH_3)_2]_4$, $Zr[N(CH_3)(C_2H_5)]_4$, $(C_5H_4)Zr[N(CH_3)_2]_3$, $((C_2H_5)C_5H_3)Zr[N(CH_3)(C_2H_5)]_3$, $Hf[N(CH_3)(C_2H_5)]_4$, $((C_2H_5)C_5H_3)Hf[N(CH_3)(C_2H_5)]_3$, or $(C_5H_4)Hf[N(CH_3)_2]_3$.

The reactant gas includes at least one selected from the group consisting of water, ozone, and oxygen plasma.

The organic/inorganic hybrid region may include a polymer and an inorganic material chemically bonded to the polymer through a reactive group of the polymer.

In the organic/inorganic hybrid region, a concentration of the inorganic material may be decreased in a direction away from the organic semiconductor layer.

The inorganic material may include a group in which aluminum and oxygen are alternately chemical-bonded, a group in which zirconium and oxygen are alternately chemical-bonded, a group in which hafnium and oxygen are alternately chemical-bonded, or a group in which titanium and oxygen are alternately chemical-bonded.

The organic semiconductor layer may include at least one selected from the group consisting of polythiophene, polyacetylene, poly(3-alkylthiophene), poly(thienylenevinylene), poly(3-hexylthiophene), and polypropylene.

Forming the organic insulating layer may include forming a polymer including a reactive group, the polymer including a reactive group including an acryl resin, polyimide, polyurethane, polyethylene terephthalate, polyethylene naphthalate, polybutylene terephthalate, or polyethersulfone.

The organic semiconductor layer may be inert to the precursor gas and the reactant gas, and forming the organic/inorganic hybrid region in the organic insulating layer may include reacting a material in the organic insulating layer with the precursor gas and the reactant gas.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, the term "or" is not exclusive. "A or B" includes any and all combinations, e.g., A, B, or A and B. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" or "include" and variations such as "comprises", "includes", or "comprising" will be understood to imply the inclusion of stated elements but not the exclusion of any other elements.

Further, in the specification, the phrase "on a plane" means viewing the object portion from the top, and the phrase "on a cross-section" means viewing a cross-section of which the object portion is vertically cut from the side.

Figure 1:
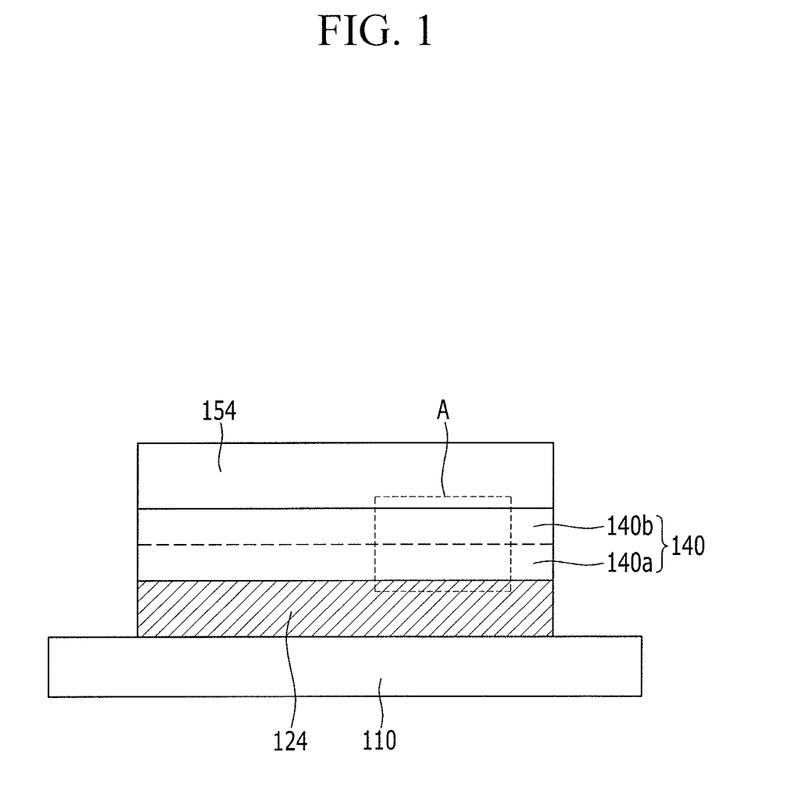
FIG. 1 illustrates a cross-sectional view schematically showing an organic thin film transistor according to an exemplary embodiment of the present disclosure.
Figure 2:
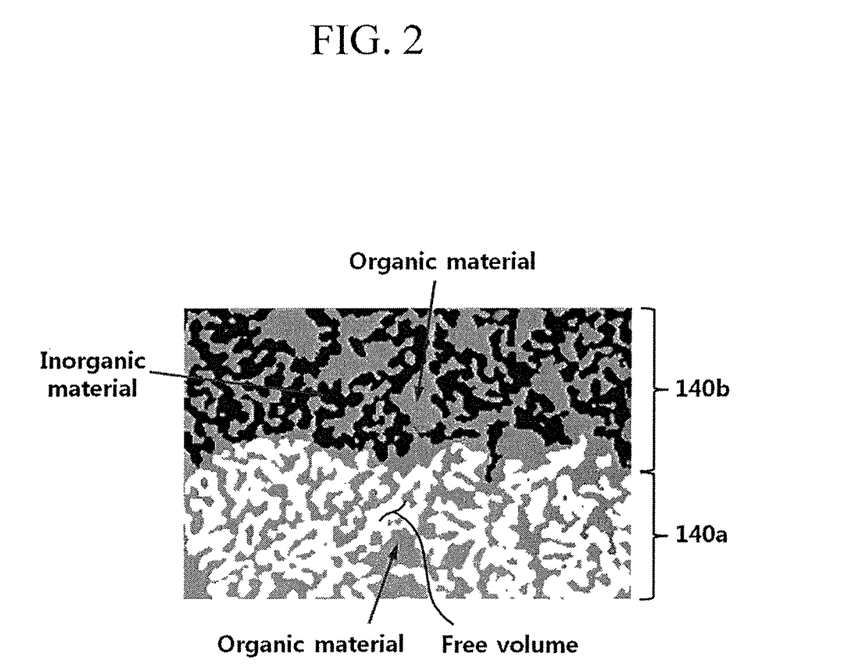
FIG. 2 illustrates an enlarged view of a portion A of FIG. 1.

FIG. 1 illustrates a cross-sectional view schematically showing an organic thin film transistor according to an exemplary embodiment of the present disclosure. FIG. 2 illustrates an enlarged view of a portion A of FIG. 1.

Referring to FIG. 1, an organic thin film transistor may be formed on a substrate 110. The organic thin film transistor may include a gate electrode 124, an insulating layer 140, and an organic semiconductor layer 154. A source electrode and a drain electrode (positioned to be separated from each other) may also be formed on the organic semiconductor layer 154. In this way, the organic thin film transistor may be made of the source/drain electrode, the gate electrode 124, the organic semiconductor layer 154, and the insulating layer 140.

A current may flow between the source electrode and the drain electrode through the organic semiconductor layer 154, and the insulating layer 140 may help prevent the current from being leaked into the gate electrode 124.

The organic semiconductor layer 154 may include, e.g., polythiophene, polyacetylene, poly(3-alkylthiophene), poly(thienylenevinylene), poly(3-hexylthiophene), or polypropylene. In an implementation, the material forming the organic semiconductor layer 154 may not include a reactor or reactive group such as "C=O" or "S=O".

In an implementation, the insulating layer 140 may include a region 140a made of an organic material and an organic/inorganic hybrid region 140b thereon.

The organic material included in the insulating layer 140 may be a polymer, e.g., an acryl resin, polyimide, polyurethane, polyethylene terephthalate, polyethylene naphthalate, polybutylene terephthalate, or polyethersulfone. For example, the organic material included in the insulating layer 140 may include a reactive group such as "C=O" or "S=O".

Next, the insulating layer 140 will be described with reference to FIG. 2 along with FIG. 1.

Referring to FIG. 1 and FIG. 2, in the present exemplary embodiment, a free volume may be formed or included in the insulating layer 140. The free volume referred to in the present disclosure means an empty space around a configuration particle among the volume occupied by the material, e.g., an open or empty space between particles. In the present exemplary embodiment, the free volume may refer to the space within or between the plurality of polymers forming the insulating layer 140 or the space between a portion where a main chain of the polymer is disconnected and the adjacent polymer. The organic semiconductor layer 154 may also be formed of a polymer such that the organic semiconductor layer 154 may also have a free volume.

The organic/inorganic hybrid region 140b may include the polymer including the reactive group and an inorganic material chemically bonded to the reactive group (e.g., such that the reactive group reacts with the inorganic material and is modified to form a linking group between the polymer and the inorganic material in the organic/inorganic hybrid region 140b). The inorganic material may include, e.g., an aluminum oxide, a zirconium oxide, a hafnium oxide, or a titanium oxide. In an implementation, the inorganic material may be positioned at the above-described free volume. For example, the inorganic material in the organic/inorganic hybrid region 140b may be included in the space between polymers. In an implementation, in the organic/inorganic hybrid region 140b, the free volume may not be present, and may be filled by the inorganic material bonded to the polymer through the reactive group. In an implementation, in the organic/inorganic hybrid region 140b, the size of the free volume may be reduced relative to that in the region 140a made of the organic material due to at least partial filling of the free volume by the inorganic material bonded to the polymer through a reaction with the reactive group.

In an implementation, in the organic/inorganic hybrid region 140b of the insulating layer 140, a distribution quantity or concentration of the inorganic material may be decreased along a direction extending away from the organic semiconductor layer 154. For example, the concentration or amount of the inorganic material may be reduced and the distribution quantity or size of the free volume may be increased closer to the region 140a made of the organic material.

Figure 3:
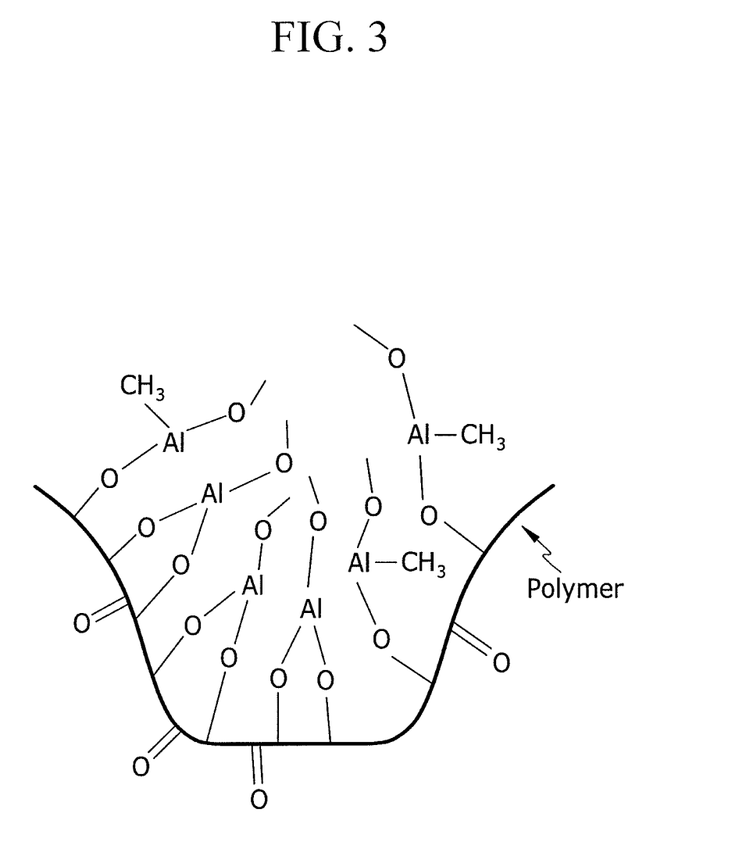
FIG. 3 illustrates a structural formula schematically showing a chemical structure of an insulating layer of the organic thin film transistor of FIG. 1.

FIG. 3 illustrates a structural formula schematically showing a chemical structure of an insulating layer of the organic thin film transistor of FIG. 1. FIG. 3 schematically shows the structural formula in which the polymer and the inorganic material are chemically bonded in the organic/inorganic hybrid region 140b of FIG. 2.

Referring to FIG. 3, as one example of the inorganic material, aluminum oxide may be chemically bonded with oxygen of the polymer. For example, the inorganic material may include a group in which aluminum and oxygen are alternately chemical-bonded. In an implementation, the inorganic material may include a group in which zirconium and oxygen are alternately chemical-bonded, a group in which hafnium and oxygen are alternately chemical-bonded, or a group in which titanium and oxygen are alternately chemical-bonded.

Again referring to FIG. 2, the region 140a made of the organic material may be positioned at the lower end of the organic/inorganic hybrid region 140b, the free volume may remain within the organic material in the region 140a made of the organic material, and the inorganic material may not be present.

Again referring to FIG. 1, in the present exemplary embodiment, each edge side wall of the organic semiconductor layer 154 and the insulating layer 140 may be substantially aligned. This structure appears by continuously forming the organic semiconductor layer 154 and the insulating layer 140 through or using the same mask. The substantial alignment means to include a degree that the organic semiconductor layer 154 and the insulating layer 140 may be slightly shifted by a process margin when forming them.

Hereinafter, a manufacturing method of an organic thin film transistor according to an exemplary embodiment of the present disclosure will be described with reference to FIG. 4 to FIG. 11.

FIG. 4 to FIG. 11 illustrate views showing stages in a manufacturing method of an organic thin film transistor according to an exemplary embodiment of the present disclosure.

Figure 4:
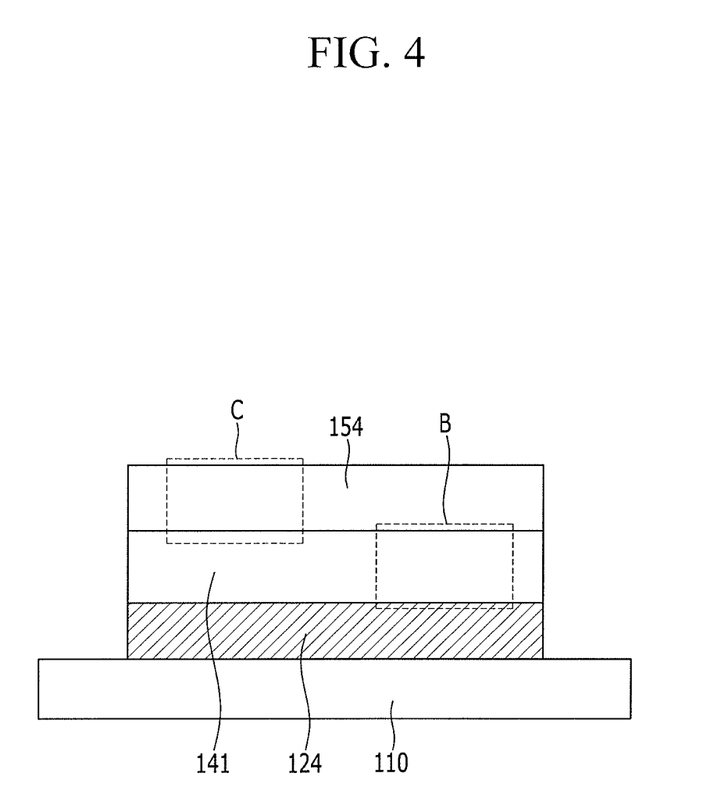
FIG. 4 to FIG. 11 illustrate views showing stages in a manufacturing method of an organic thin film transistor according to an exemplary embodiment of the present disclosure.

Referring to FIG. 4, a gate electrode 124 may be formed on a substrate 110, and an organic insulating material layer and an organic semiconductor material layer may be sequentially deposited and patterned on the gate electrode 124 to form an organic insulating layer 141 and an organic semiconductor layer 154. In this case, the organic insulating material layer and the organic semiconductor material layer may be patterned at the same time by using the same mask, and each edge side wall of the organic semiconductor layer 154 and the organic insulating layer 141 may be substantially aligned.

In an implementation, the organic insulating material layer may include, e.g., acryl resin, polyimide, polyurethane, polyethylene terephthalate, polyethylene naphthalate, polybutylene terephthalate, or polyethersulfone. In an implementation, the organic semiconductor material layer may include, e.g., polythiophene, polyacetylene, poly(3-alkylthiophene), poly(thienylenevinylene), poly(3-hexylthiophene), or polypropylene.

Figure 5:
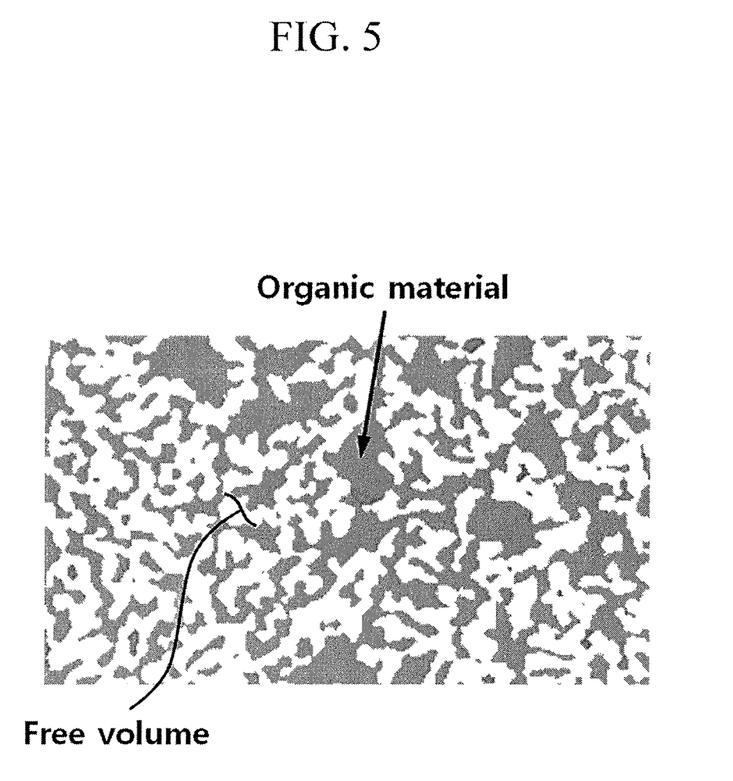

FIG. 5 enlarges the portion B of FIG. 4, and referring to FIG. 5, the organic insulating layer 141 may be made of the organic material, and the free volume may be formed within the organic insulating layer 141. The organic insulating layer 141 formed in the step of FIG. 4 is shown to only be formed of the organic material. In an implementation, in a portion C of FIG. 4, like FIG. 5, the free volume may be formed within the organic material.

Figure 6:
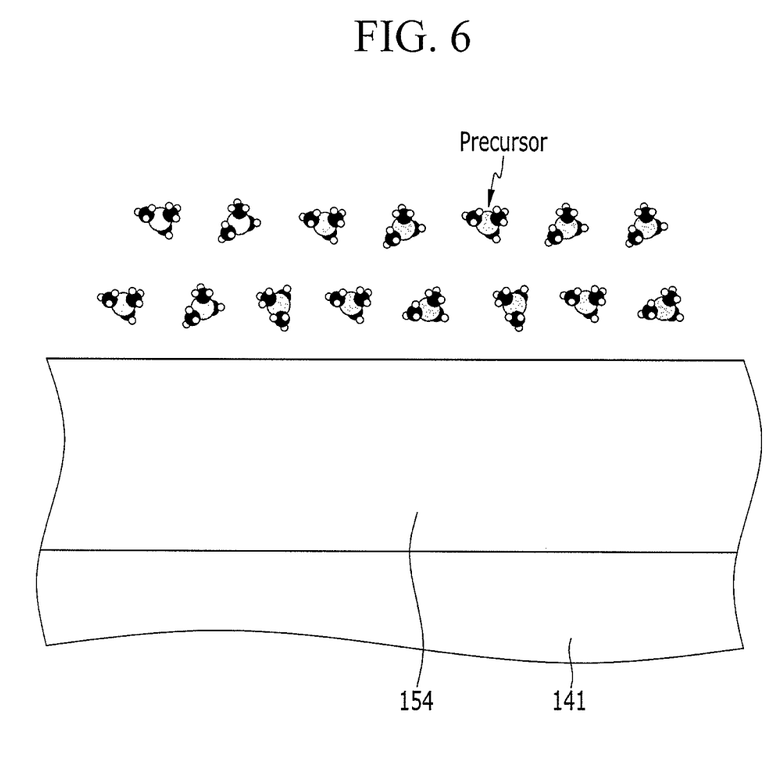

FIG. 6 illustrates the portion C of FIG. 4, and a precursor gas atmosphere may be formed on or over the organic insulating layer 141 and the organic semiconductor layer 154. This step is a precursor gas injection step, and the precursor gas injection step may be performed for about 1-5 seconds. Next, a precursor gas exposure step may be performed for several tens of seconds, e.g., 60 seconds, such that the precursor gas passes through the organic semiconductor layer 154 (which includes a material without a reactive group) to be diffused to the free volume of the organic insulating layer 141. Next, to remove the remaining precursor gas in the surface of the organic semiconductor layer 154, a purging step may be performed for about 60 seconds.

In an implementation, the precursor gas may include a material for forming, e.g., aluminum oxide, the titanium oxide, the zirconium oxide, or the hafnium oxide. For example, the precursor gas may include a compound that is a precursor for forming aluminum oxide, the titanium oxide, the zirconium oxide, or the hafnium oxide. In an implementation, the precursor gas may include, e.g., $Al(CH_3)_3$, $Al[C(CH_3)_3]_3$, $TiCl_4$, $Ti[N(CH_3)(C_2H_5)]_4$, $Ti[N(CH_3)_2]_4$, $Zr[N(CH_3)(C_2H_5)]_4$, $(C_5H_4)Zr[N(CH_3)_2]_3$, $((C_2H_5)C_5H_3)Zr[N(CH_3)(C_2H_5)]_3$, $Hf[N(CH_3)(C_2H_5)]_4$, $((C_2H_5)C_5H_3)Hf[N(CH_3)(C_2H_5)]_3$, and $(C_5H_4)Hf[N(CH_3)_2]_3$.

Here, $Al(CH_3)_3$ is TMA (trimethylaluminum), $Al[C(CH_3)_3]_3$ is tris(tertiary-butyl)aluminum, $TiCl_4$ is titanium tetrachloride, $Ti[N(CH_3)(C_2H_5)]_4$ is tetrakis(ethylmethylamino)titanium, $Ti[N(CH_3)_2]_4$ is tetrakis(dimethylamino)titanium, $Zr[N(CH_3)(C_2H_5)]_4$ is tetrakis(ethylmethylamino)zirconium, $(C_5H_4)Zr[N(CH_3)_2]_3$ is cyclopentadienyl tris(dimethylamino)zirconium, $((C_2H_5)C_5H_3)Zr[N(CH_3)(C_2H_5)]_3$ is ethylcyclopentadienyl tris(ethylmethylamino)zirconium, $Hf[N(CH_3)(C_2H_5)]_4$ is tetrakis (ethylmethylamino)hafnium, $((C_2H_5)C_5H_3)Hf[N(CH_3)(C_2H_5)]_3$ is ethylcyclopentadienyl tris(ethylmethylamino)hafnium, and $(C_5H_4)Hf[N(CH_3)_2]_3$ is cyclopentadienyl tris(dimethylamino)hafnium.

Figure 7:
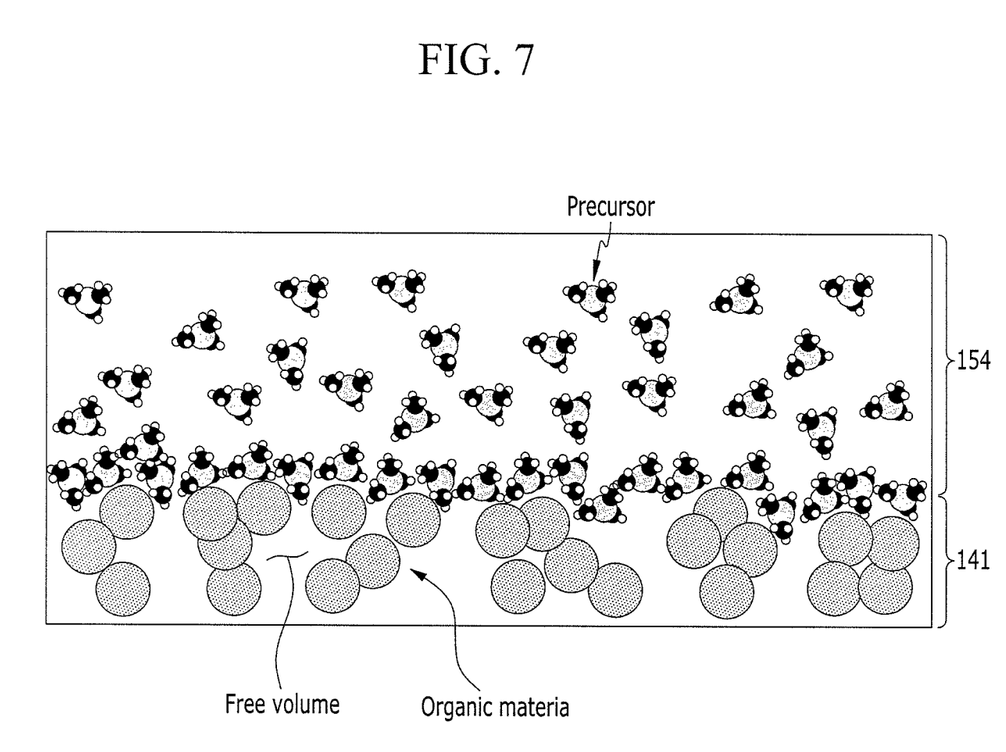
Figure 8:
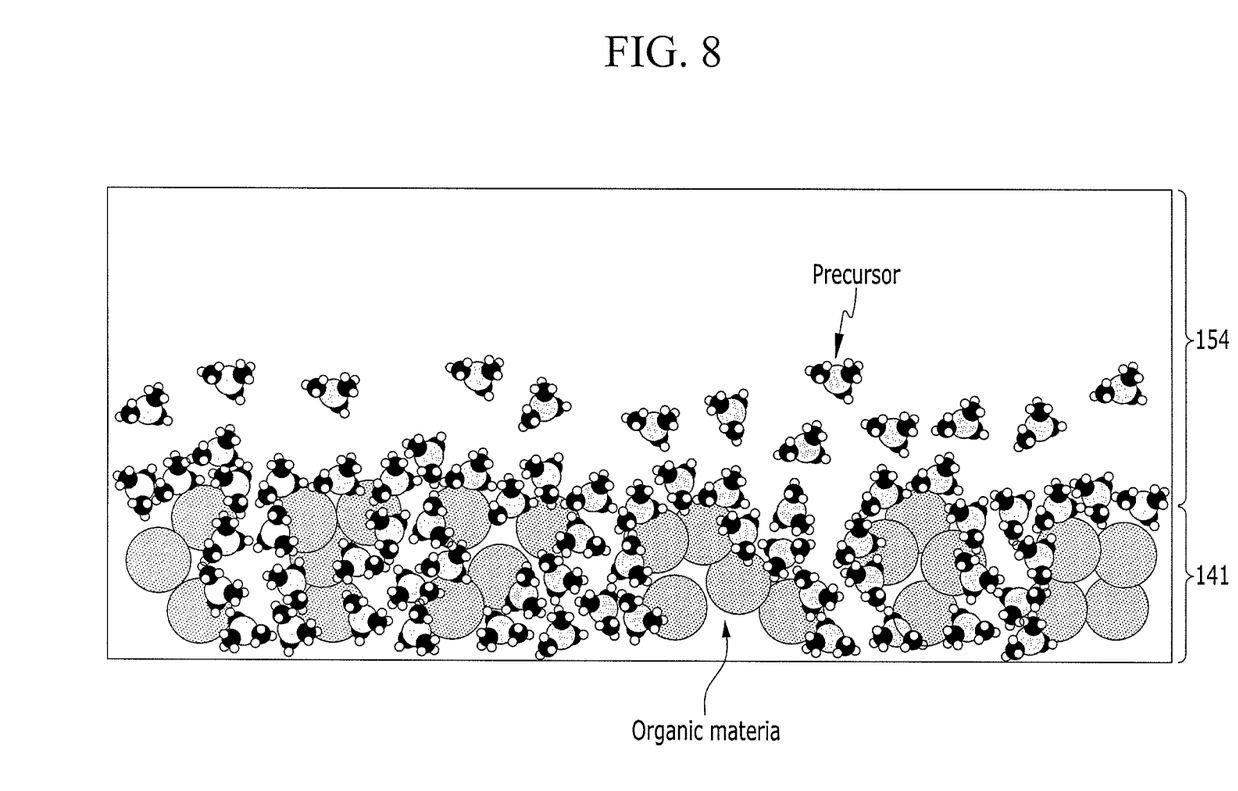

FIG. 7 and FIG. 8 illustrate a boundary portion of the organic semiconductor layer 154 and the organic insulating layer 141 shown in FIG. 4.

FIG. 7 shows a state in which the precursor gas passing through the free volume of the organic semiconductor layer 154 is diffused to the surface of the organic insulating layer 141, and FIG. 8 shows a state in which the precursor gas is injected to the free volume of the organic insulating layer 141 and is reacted with the organic material.

Figure 9:
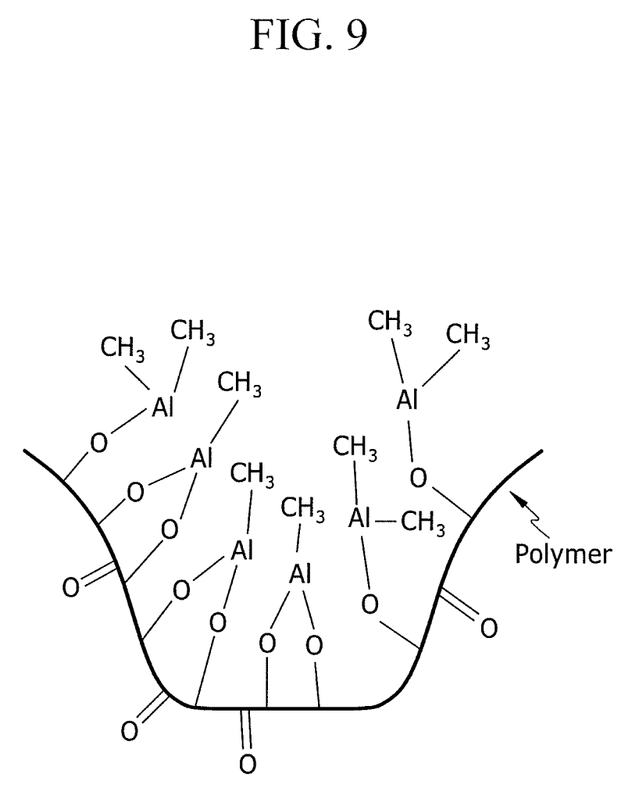

FIG. 9 schematically shows a structural formula in which the organic material and the precursor are chemically bonded in the step of FIG. 8. Referring to FIG. 9, oxygen included in the reactive group of the organic material and a metal of the precursor may be bonded. For example, the oxygen connected to the polymer main chain of the organic material and aluminum may be bonded to each other.

Next, similar to FIG. 6, a reactant gas atmosphere may be formed on or over the organic insulating layer 141 and the organic semiconductor layer 154. The reactant gas may include, e.g., a gas for converting the material illustrated in FIG. 9 into the material illustrated in FIG. 3. The reactant gas may include, e.g., water, ozone, or oxygen plasma. This step is a reactant gas injection step, and the reactant gas injection step may be performed for about 1-5 seconds. Next, the reactant gas exposure step is performed for several tens of seconds, e.g., 60 seconds, such that the reactant gas passes through the organic semiconductor layer 154 (including the material without the reactive group) and is diffused to the free volume of the organic insulating layer 141. Next, to remove the remaining reactant gas in the surface of the organic semiconductor layer 154, the purging step may be performed for about 60 seconds.

Figure 10:
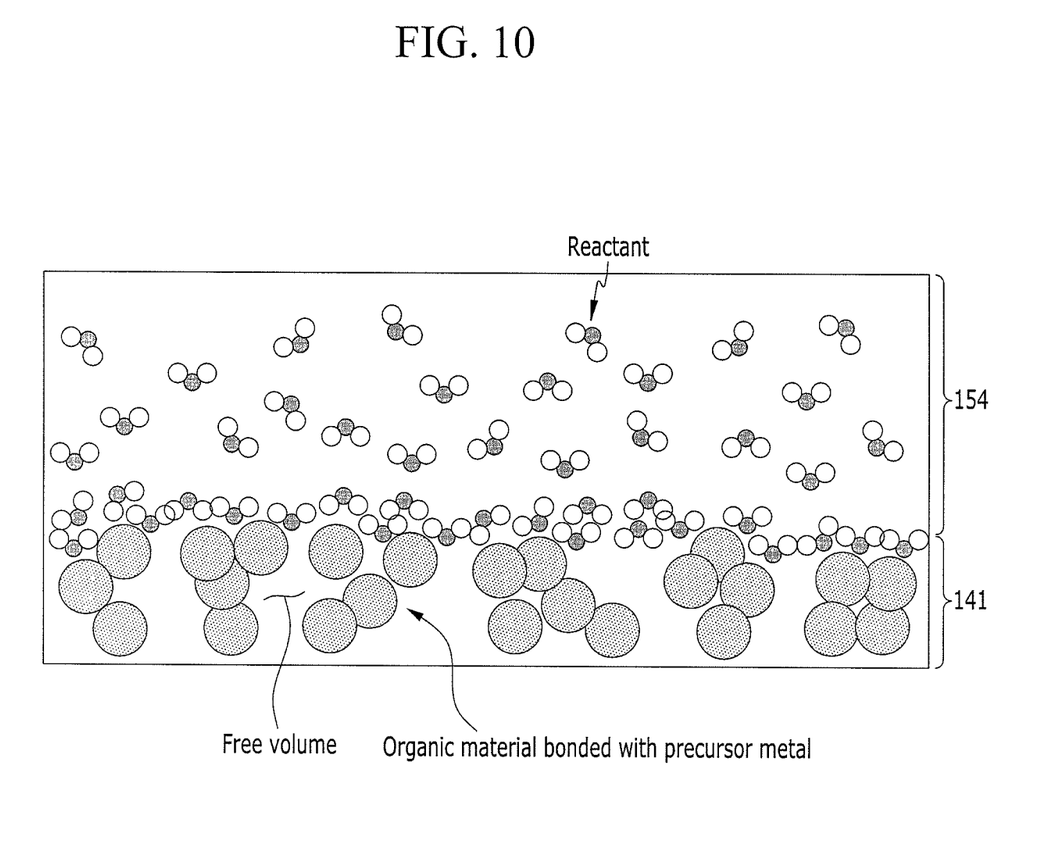
Figure 11:
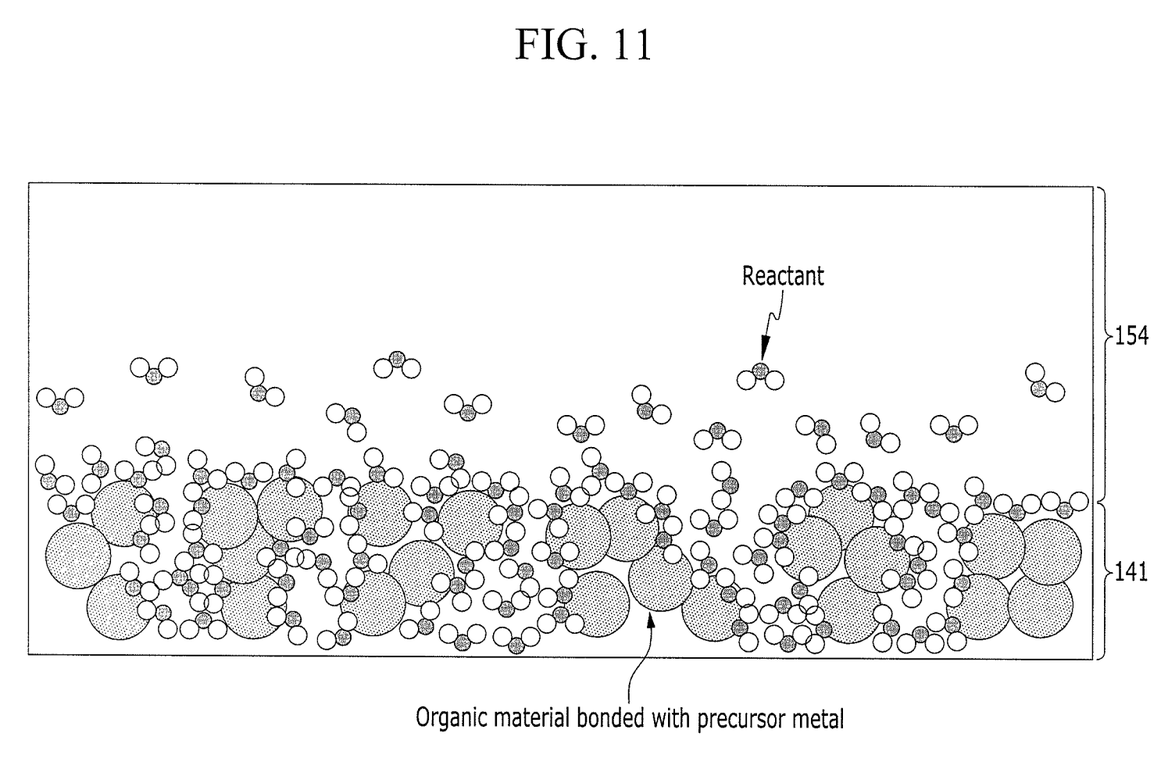

FIG. 10 and FIG. 11 illustrate the boundary portion of the organic semiconductor layer 154 and the organic insulating layer 141 shown in FIG. 4.

FIG. 10 shows the state in which the reactant gas passing through the free volume of the organic semiconductor layer 154 is diffused to the surface of the organic insulating layer 141, and FIG. 11 shows the state in which the reactant gas is injected into the free volume of the organic insulating layer 141 and is reacted with the metal of the precursor bonded with the organic material. For example, as shown in FIG. 9, aluminum bonded with oxygen in the free volume and the reactant gas may be reacted to be chemically bonded, and the group in which the aluminum and oxygen shown in FIG. 3 are alternately chemical-bonded may be formed. For example, the material of the organic semiconductor layer 154 may be inert to the precursor gas and/or the reactant gas.

The above-described process steps of FIG. 6 to FIG. 10 may be repeatedly performed. If these processes are performed, the organic/inorganic hybrid region 140b shown in FIG. 1 may be formed in the organic insulating layer 141.

In an implementation, a step of injecting a large amount of oxygen to the organic insulating layer 141 may be performed to remove any remaining methyl group in the organic insulating layer 141.

By way of summation and review, an organic thin film transistor may use an inorganic insulating layer such as a silicon oxide and a silicon nitride to help reduce or prevent a leakage current. A high process temperature and a manufacturing process accompanying forming the inorganic insulating layer may raise concerns.

As described above, according to the exemplary embodiments of the present disclosure, the organic insulating layer and the organic semiconductor layer may be simultaneously formed such that the process time and the cost may be reduced, and the organic semiconductor layer may be formed of a material without a reactive group such that damage to the organic semiconductor layer may be reduced and/or prevented when forming the organic/inorganic hybrid region.

The embodiments may provide an organic thin film transistor including an insulating layer formed without damage in an organic semiconductor, which may help reduce and/or prevent a leakage current.

According to an embodiment, the organic/inorganic hybrid region may be formed in the organic thin film transistor such that the leakage current may be reduced and/or prevented, and when forming the organic thin film transistor, the process may be simplified such that the time and the cost may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

| <Description of symbols> | |
|---|---|
| 110: substrate | 124: gate electrode |
| 140: insulating layer | 140a: region made of an organic material |
| 140b: organic/inorganic hybrid region | 141: organic insulating layer |
| 154: organic semiconductor layer | |

What is claimed is:

1. An organic thin film transistor, comprising:
   a gate electrode;
   an organic semiconductor layer overlapping the gate electrode; and
   an insulating layer between the gate electrode and the organic semiconductor layer, the insulating layer having an organic/inorganic hybrid region,
   wherein:
   the organic/inorganic hybrid region includes a polymer and an inorganic material that is chemically bonded to the polymer through a reactive group on the polymer,
   the insulating layer includes a space adjacent to the polymer, the inorganic material being positioned in the space, and
   the inorganic material includes a group in which aluminum and oxygen are alternately chemical-bonded, a group in which zirconium and oxygen are alternately chemical-bonded, a group in which hafnium and oxygen are alternately chemical-bonded, or a group in which titanium and oxygen are alternately chemical-bonded.

2. The organic thin film transistor as claimed in claim 1, wherein, in the organic/inorganic hybrid region, a concentration of the inorganic material is decreased in a direction away from the organic semiconductor layer.

3. The organic thin film transistor as claimed in claim 1, wherein the insulating layer further includes a region including an organic material, the region including the organic material being between the gate electrode and the organic/inorganic hybrid region.

4. The organic thin film transistor as claimed in claim 1, wherein the organic semiconductor layer includes at least one selected from the group consisting of polythiophene, polyacetylene, poly(3-alkylthiophene), poly(thienylenevinylene), poly(3-hexylthiophene), and polypropylene.

5. The organic thin film transistor as claimed in claim 1, wherein the polymer including the reactive group includes an acryl resin, polyimide, polyurethane, polyethylene terephthalate, polyethylene naphthalate, polybutylene terephthalate, or polyethersulfone.

6. The organic thin film transistor as claimed in claim 1, wherein edge side walls of the organic semiconductor layer and the insulating layer are substantially aligned.

7. A display device including the organic thin film transistor as claimed in claim 1.

8. A method for manufacturing an organic thin film transistor, the method comprising:
   forming a gate electrode on a substrate;
   forming an organic insulating layer on the gate electrode;
   forming an organic semiconductor layer on the organic insulating layer;
   exposing the organic semiconductor layer and the organic insulating layer to a precursor gas atmosphere;
   exposing the organic semiconductor layer and the organic insulating layer to a reactant gas atmosphere; and
   forming an organic/inorganic hybrid region in the organic insulating layer.

9. The method as claimed in claim 8, wherein forming the organic insulating layer and the organic semiconductor layer is performed using the same mask.

10. The method as claimed in claim 8, wherein the precursor gas includes a material that reacts to form an aluminum oxide, a titanium oxide, a zirconium oxide, or a hafnium oxide.

11. The method as claimed in claim 10, wherein the precursor gas includes $Al(CH_3)_3$, $Al[C(CH_3)_3]_3$, $TiCl_4$, $Ti[N(CH_3)(C_2H_5)]_4$, $Ti[N(CH_3)_2]_4$, $Zr[N(CH_3)(C_2H_5)]_4$, $(C_5H_4)$ $Zr[N(CH_3)_2]_3$, $((C_2H_5)C_5H_3)Zr[N(CH_3)(C_2H_5)]_3$, $Hf[N(CH_3)(C_2H_5)]_4$, $((C_2H_5)C_5H_3)Hf[N(CH_3)(C_2H_5)]_3$, or $(C_5H_4)Hf[N(CH_3)_2]_3$.

12. The method as claimed in claim 8, wherein the reactant gas includes water, ozone, or oxygen plasma.

13. The method as claimed in claim 8, wherein the organic/inorganic hybrid region includes a polymer and an inorganic material chemically bonded to the polymer through a reactive group of the polymer.

14. The method as claimed in claim 13, wherein, in the organic/inorganic hybrid region, a concentration of the inorganic material is decreased in a direction away from the organic semiconductor layer.

15. The method as claimed in claim 13, wherein the inorganic material includes a group in which aluminum and oxygen are alternately chemical-bonded, a group in which zirconium and oxygen are alternately chemical-bonded, a group in which hafnium and oxygen are alternately chemical-bonded, or a group in which titanium and oxygen are alternately chemical-bonded.

16. The method as claimed in claim 8, wherein the organic semiconductor layer includes polythiophene, polyacetylene, poly(3-alkylthiophene), poly(thienylenevinylene), poly(3-hexylthiophene), or polypropylene.

17. The method as claimed in claim 8, wherein forming the organic insulating layer includes forming a polymer including a reactive group, the polymer including a reactive group including an acryl resin, polyimide, polyurethane, polyethylene terephthalate, polyethylene naphthalate, polybutylene terephthalate, or polyethersulfone.

18. The method as claimed in claim 8, wherein:

the organic semiconductor layer is inert to the precursor gas and the reactant gas, and forming the organic/inorganic hybrid region in the organic insulating layer includes reacting a material in the organic insulating layer with the precursor gas and the reactant gas.

* * * * *